(12) United States Patent
Liao et al.

(10) Patent No.: US 12,557,638 B2
(45) Date of Patent: Feb. 17, 2026

(54) SEMICONDUCTOR DEVICE

(71) Applicant: MACRONIX INTERNATIONAL CO., LTD., Hsinchu (TW)

(72) Inventors: Ting-Feng Liao, Hsin-chu (TW);
Mao-Yuan Weng, Hualien (TW);
Kuang-Wen Liu, Hsin-chu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 371 days.

(21) Appl. No.: 18/321,020

(22) Filed: May 22, 2023

(65) Prior Publication Data

US 2024/0395705 A1 Nov. 28, 2024

(51) Int. Cl.
*H01L 23/528* (2006.01)
*H10B 41/10* (2023.01)
*H10B 41/27* (2023.01)

(52) U.S. Cl.
CPC ......... *H01L 23/5283* (2013.01); *H10B 41/10* (2023.02); *H10B 41/27* (2023.02)

(58) Field of Classification Search
None
See application file for complete search history.

(56) References Cited

U.S. PATENT DOCUMENTS

| | | | |
|---|---|---|---|
| 2018/0130816 A1 | 5/2018 | Son | |
| 2020/0127009 A1 | 4/2020 | Song | |
| 2020/0350326 A1* | 11/2020 | Yun | H10B 41/10 |
| 2021/0202520 A1 | 7/2021 | Jung | |
| 2021/0210505 A1* | 7/2021 | Choi | H10B 43/40 |
| 2022/0359556 A1 | 11/2022 | Liao | |

FOREIGN PATENT DOCUMENTS

TW 202316640 A 4/2023

\* cited by examiner

*Primary Examiner* — Sarah K Salerno
(74) *Attorney, Agent, or Firm* — McClure, Qualey & Rodack, LLP

(57) ABSTRACT

The semiconductor device includes a substrate, a stack disposed on the substrate, a first common source line and a second common source line disposed in the stack and connected to the substrate. The stack includes insulating layers and conductive layers alternately arranged. The first common source line and the second common source line are extended along a first direction and are arranged in a second direction that is perpendicular to the first direction. The first common source line includes a first segment and a second segment spaced apart by a first common source line cut. The second common source line includes a third segment and a fourth segment spaced apart by a second common source line cut. The first common source line cut is shifted relative to the second common source line cut in the first direction. A method of forming the semiconductor device is also disclosed.

12 Claims, 14 Drawing Sheets

SEMICONDUCTOR DEVICE

BACKGROUND

Field of Invention

The present invention relates to a semiconductor device and a method of fabricating the same.

Description of Related Art

In recent years, the structures of semiconductor devices have been changed constantly, and the storage capacity of the devices has been increased continuously. Memory devices are used in storage elements for many products such as digital cameras, mobile phones, computers, etc. As the application increases, the demand for the memory device focuses on small size and large memory capacity. For satisfying the requirement, a memory device having a high element density and a small size and the manufacturing method thereof are in need.

As such, it is desirable to develop a three-dimensional (3D) memory device with larger number of multiple stacked planes to achieve greater storage capacity, improved qualities, all the while remaining in a small size.

SUMMARY

An aspect of the disclosure provides a semiconductor device. The semiconductor device includes a substrate, a stack disposed on the substrate, a first common source line and a second common source line disposed in the stack and connected to the substrate. The stack includes a plurality of insulating layers and a plurality of conductive layers alternately arranged. The first common source line is extended along a first direction. The first common source line includes a first segment and a second segment spaced apart by a first common source line cut. The second common source line is extended along the first direction. The second common source line includes a third segment and a fourth segment spaced apart by a second common source line cut. The first common source line and the second common source line are arranged in a second direction that is perpendicular to the first direction, and the first common source line cut is shifted relative to the second common source line cut in the first direction.

According to some embodiments of the disclosure, the second common source line is directly neighboring the first common source line.

According to some embodiments of the disclosure, the semiconductor device further includes a third common source line including a fifth segment and a sixth segment spaced apart by a third common source line cut. The second common source line is between the third common source line and the first common source line, and the third common source line cut is shifted relative to the second common source line cut in the first direction.

According to some embodiments of the disclosure, the third common source line cut is aligned with or shifted relative to the first common source line cut in the first direction.

According to some embodiments of the disclosure, each of the first common source line cut and the second common source line cut includes a first isolation structure at a top of the stack and a second isolation structure at a bottom of the stack.

According to some embodiments of the disclosure, a second width of the second isolation structure is greater than a first width of the first isolation structure, in which the first width and the second width are measured in the second direction.

According to some embodiments of the disclosure, the stack includes a ground select line region on the substrate, a string select line region, and a word line region between the ground select line region and the string select line region. The first isolation structure is disposed in the string select line region, and the second isolation structure is disposed in the ground select line region.

According to some embodiments of the disclosure, the conductive layers includes a word line in the word line region, and the word line extends through the first common source line cut and the second common source line cut.

According to some embodiments of the disclosure, the first isolation structure and the second isolation structure are oxide.

According to some embodiments of the disclosure, a bottom surface of the second isolation structure is below a top surface of the substrate.

According to some embodiments of the disclosure, a bottom surface of the first common source line is below a bottom surface of the second isolation structure.

According to some embodiments of the disclosure, the semiconductor device further includes a plurality of vertical channel structures disposed in the stack and connected to the substrate.

According to some embodiments of the disclosure, the semiconductor device further includes an isolation spacer between the first common source line and the conductive layers.

Another aspect of the disclosure provides a method of forming a semiconductor device. The method includes forming a stack on a substrate, forming a plurality of second isolation structures in a bottom of the stack, forming a plurality of first isolation structures in a top of the stack, and forming a plurality of trenches in the stack. The stack includes a plurality of insulating layers and a plurality of sacrificial layers alternately arranged. The second isolation structures include a first ground select line cut and a second ground select line cut. The first isolation structures include a first string select line cut over the first ground select line cut and a second string select line cut over the second ground select line cut. The trenches include a first trench crossing the first ground select line cut and the first string select line cut and a second trench crossing the second ground select line cut and the second string select line cut. The method further includes forming a first common source line in the first trench and a second common source line in the second trench, wherein the first common source line and the second common source line are extended along a first direction and are arranged in a second direction that is perpendicular to the first direction, and the first ground select line cut is shifted relative to the second ground select line cut in the first direction.

According to some embodiments of the disclosure, the second isolation structures are formed such that a second width of each of the second isolation structures is greater than a first width of each of the first isolation structures, in which the first width and the second width are measured in the second direction.

According to some embodiments of the disclosure, portions of the sacrificial layers between the first isolation structures and the second isolation structures are remained after the trenches are formed.

According to some embodiments of the disclosure, the method further includes replacing the sacrificial layers with a plurality of conductive layers.

According to some embodiments of the disclosure, the method further includes forming a plurality of vertical channel structures in the stack and connected to the substrate.

According to some embodiments of the disclosure, the first isolation structures are formed after forming the vertical channel structures.

According to some embodiments of the disclosure, the second common source line is directly neighboring the first common source line.

The common source lines are cut by the common source line cuts including the first isolation structures and the second isolation structures into a plurality of segments. The positions of the common source line cuts in the neighboring common source lines are shifted. The stress caused by oxide expansion can be released through the shifted common source line cuts and would not be accumulated thereby preventing the common source lines from being bended during the thermal manufacturing process.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
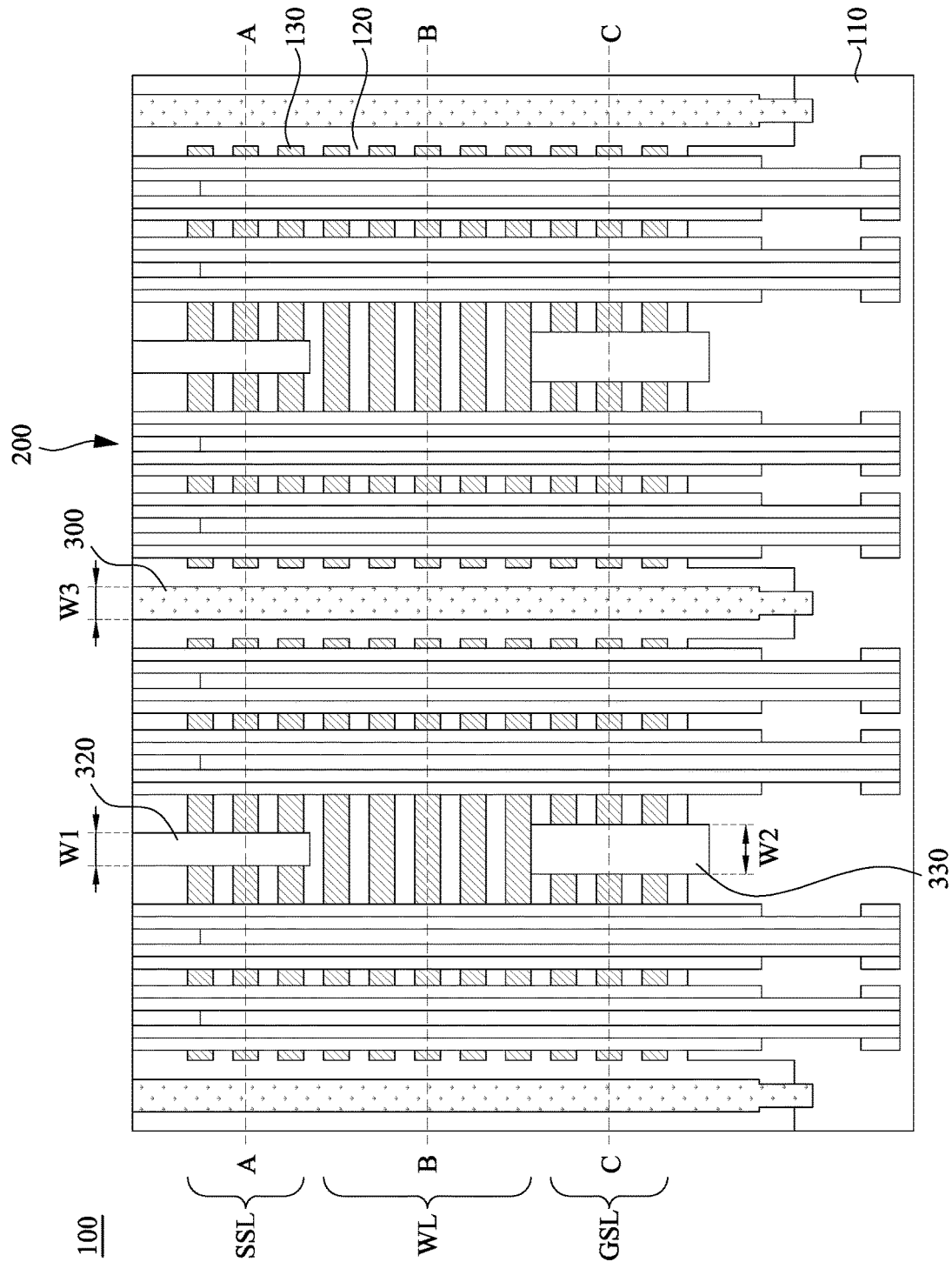
FIG. 1 is a cross-sectional view of a semiconductor device according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
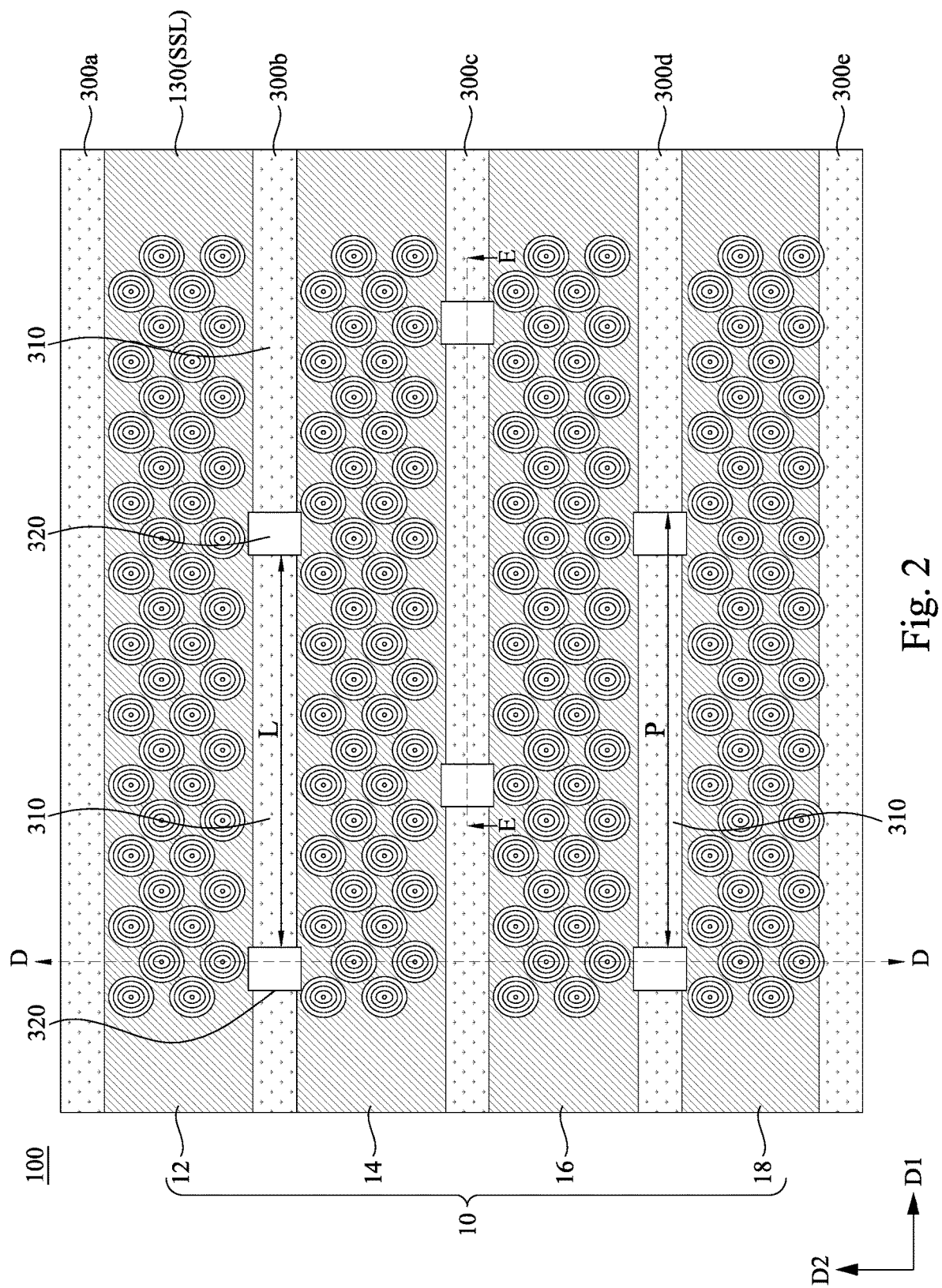
FIG. 2 is a top view at plane A-A of the semiconductor device of FIG. 1.
Figure 3:
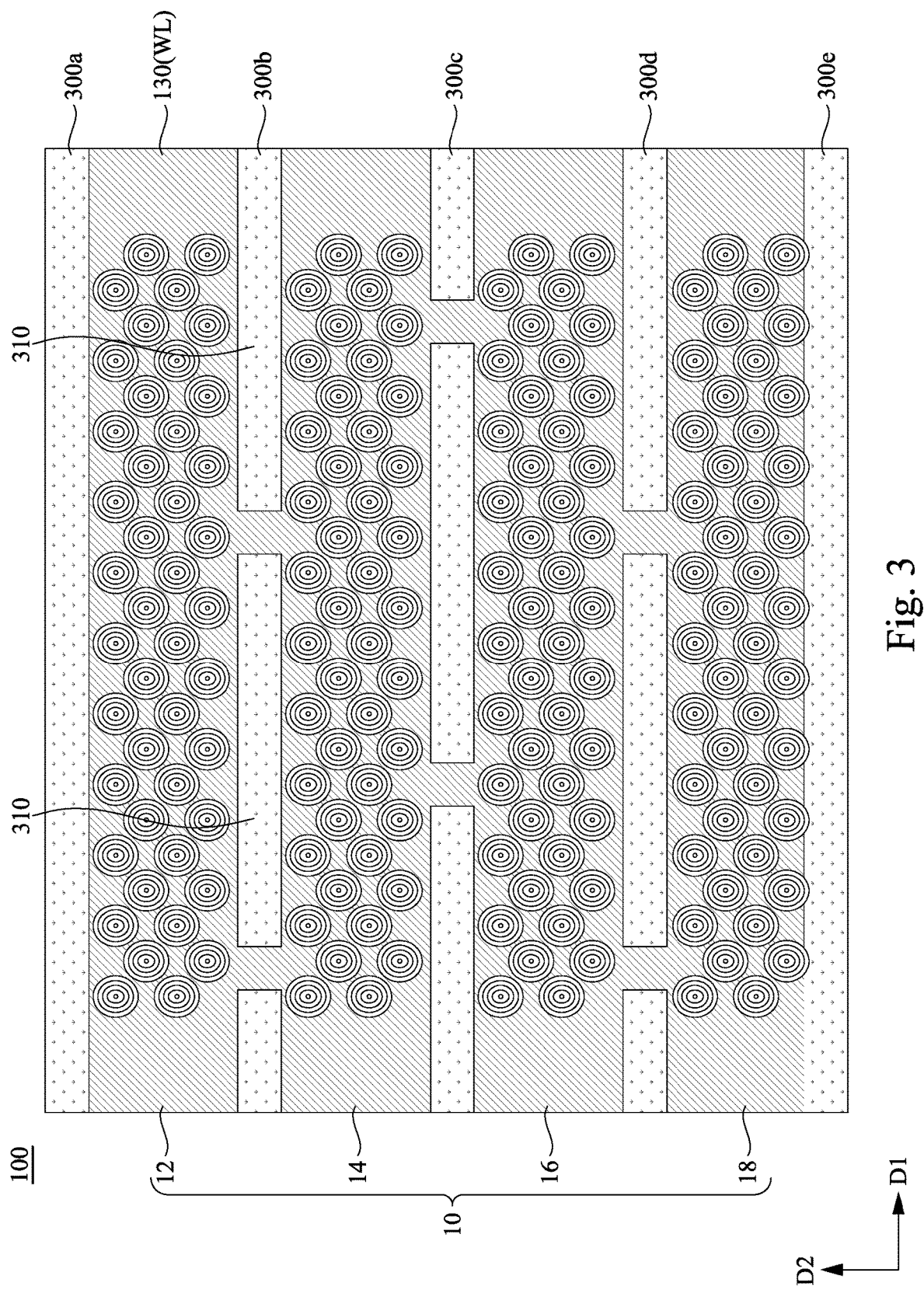
FIG. 3 is a top view at plane B-B of the semiconductor device of FIG. 1.
Figure 4:
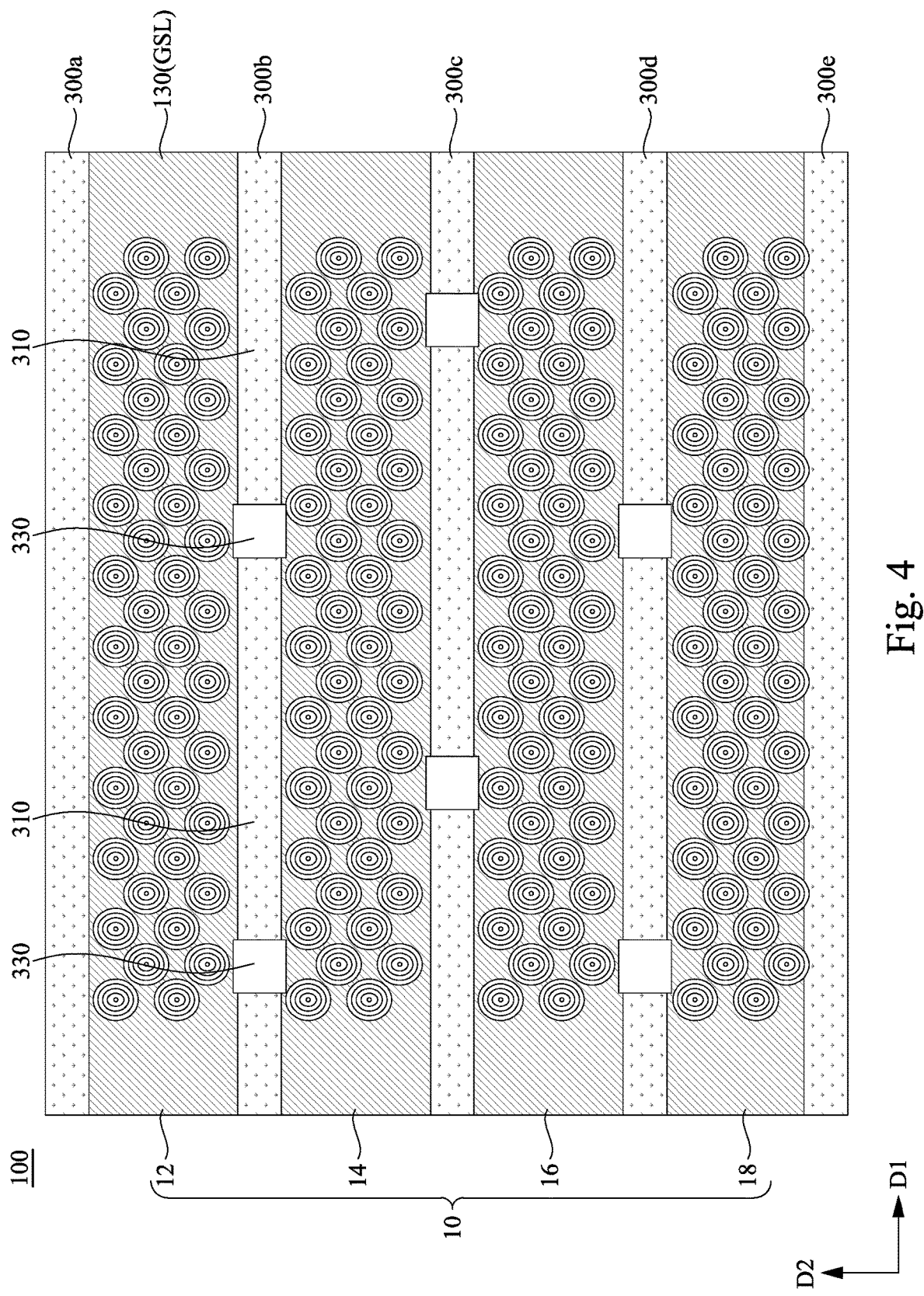
FIG. 4 is a top view at plane C-C of the semiconductor device of FIG. 1.
Figure 5:
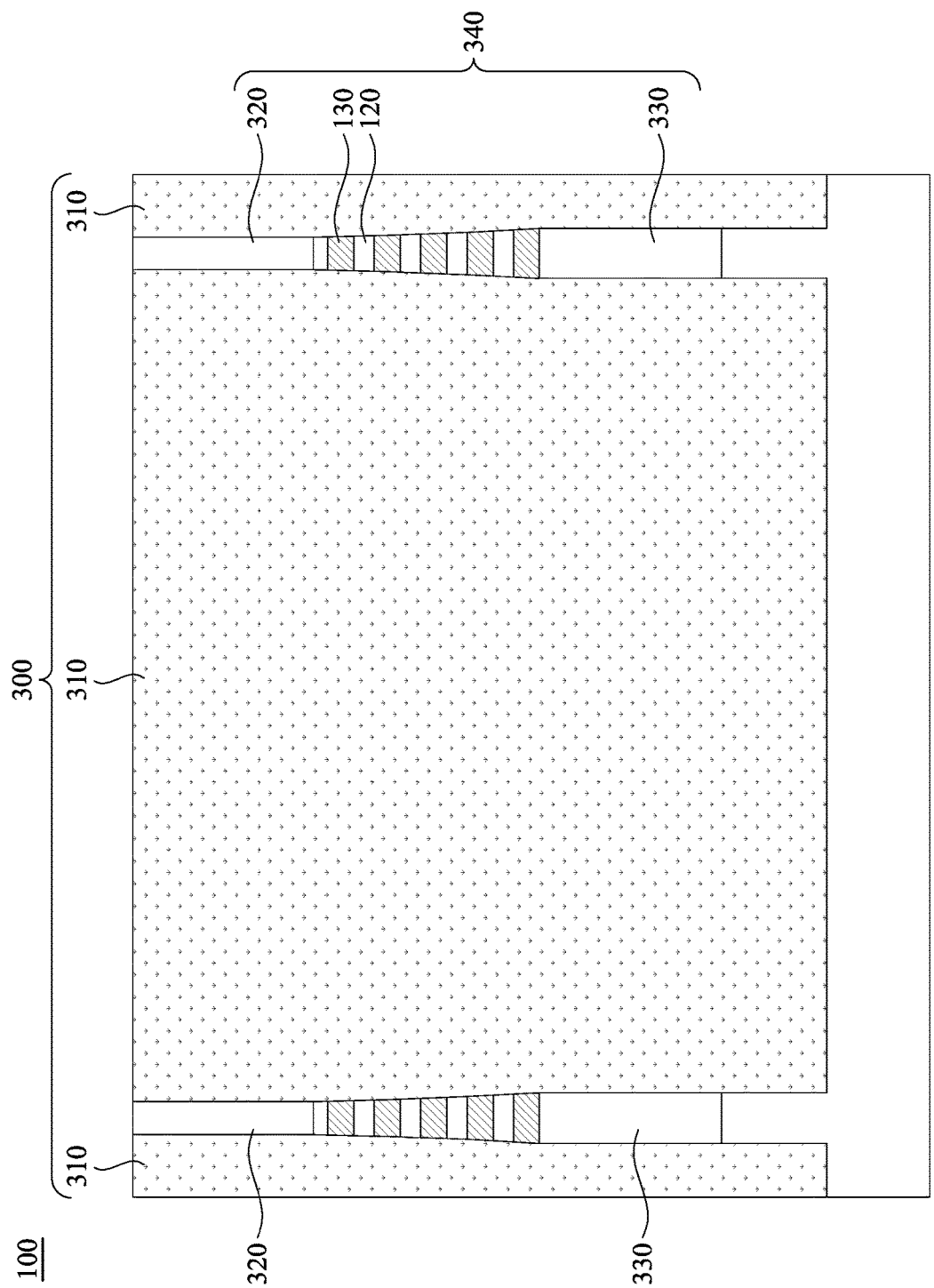
FIG. 5 is a cross-section taken along line E-E of the semiconductor device of FIG. 2.

Reference is made to FIG. 1 to FIG. 5, in which FIG. 1 and FIG. 5 are cross-sectional views of a semiconductor device according to some embodiments of the disclosure, FIG. 2 is a top view at plane A-A of the semiconductor device of FIG. 1, FIG. 3 is a top view at plane B-B of the semiconductor device of FIG. 1, and FIG. 4 is a top view at plane C-C of the semiconductor device of FIG. 1. More particularly, FIG. 1 is a cross-section taken along line D-D of the semiconductor device of FIG. 2, and FIG. 5 is a cross-section taken along line E-E of the semiconductor device of FIG. 2.

The semiconductor device 100 includes a substrate 110, a plurality of insulating layers 120 and a plurality of conductive layers 130 alternatively stacked on the substrate 110. The semiconductor device 100 further includes a plurality of vertical channel structures 200 arranged parallel to the normal direction of the substrate 110. The vertical channel structures 200 are formed penetrating the stack of the insulating layers 120 and the conductive layers 130 and are further extend into the substrate 110.

The conductive layers 130 include one or more conductive materials such as tungsten (W) or the likes as filling metal. In some embodiments, one or more of the conductive layers 130 at top of the semiconductor device 100 serve as string select lines (SSL) of the semiconductor device 100, one or more of the conductive layers 130 at bottom of the semiconductor device 100 serve as ground select lines (GSL) of the semiconductor device 100, and the rest of the conductive layers 130 serve as word lines (WL) of the semiconductor device 100. The conductive layers 130 surround the vertical channel structures 200, respectively. Therefore, the semiconductor device 100 can be also referred as gate-all-around (GAA) semiconductor device.

The semiconductor device 100 further includes a plurality of common source lines 300 to separate the vertical channel structures 200 into a plurality of regions based on the operation requirement. For example, an operation block 10 is shown in FIGS. 2-4, and the operation block 10 includes a plurality of sub-blocks 12, 14, 16, and 18 defined by the common source lines 300.

The common source lines 300 such as the common source lines 300a and 300e at the boundary of the operation block 10 are continuous, and the common source lines 300b, 300c, and 300d between the common source lines 300a and 300e are divided into a plurality of segments 310.

Referring to FIG. 2, at the top (e.g. SSL region) of the semiconductor device 100, the common source lines 300b, 300c, and 300d are cut by a plurality of first isolation structures 320. Because the first isolation structures 320 are formed at the SSL region of the semiconductor device 100, the first isolation structures 320 can be also referred as SSL cuts. Each of the conductive layers 130 at the SSL region is divided by common source lines 300b, 300c, and 300d and the first isolation structures 320 into a plurality regions corresponding to the sub-blocks 12, 14, 16, and 18.

Referring to FIG. 3, at the middle (e.g. WL region) of the semiconductor device 100, the common source lines 300b, 300c, and 300d are cut into segments 310 that are discontinuous. Each of the conductive layers 130 at the WL region is communicated between the common source lines 300b, 300c, and 300d. That is, the spaces between the segments 310 of the common source lines 300b, 300c, and 300d are filled by the conductive layer 130.

Referring to FIG. 4, at the bottom (e.g. GSL region) of the semiconductor device 100, the common source lines 300b, 300c, and 300d are cut by a plurality of second isolation structures 330. Because the second isolation structures 330 are formed at the GSL region of the semiconductor device 100, the second isolation structures 330 can be also referred as GSL cuts. Each of the conductive layers 130 at the GSL region is divided by common source lines 300b, 300c, and 300d and the second isolation structures 330 into a plurality regions corresponding to the sub-blocks 12, 14, 16, and 18.

Referring to FIG. 5, at opposite sides of each of the segment 310 of the common source line 300, a pair of the first isolation structures 320 are arranged at the SSL region and are directly in contact with the segment 310 of the common source line 300, a pair of the second isolation structures 330 are arranged at the GSL region and are directly in contact with the segment 310 of the common source line 300. The stack of the insulating layers 120 and the conductive layers 130 are arranged between the first isolation structures 320 and the second isolation structures 330, and the stack of the insulating layers 120 and the conductive layers 130 are directly in contact with the segment 310 of the common source line 300, at the WL region.

As shown in FIG. 5, the space between adjacent two of the segments 310 of common source line 300 is filled by, from bottom to top, the second isolation structures 330, the stack of the insulating layers 120 and the conductive layers 130, and the first isolation structures 320. Namely, the second isolation structure 330, the stack of the insulating layers 120 and the conductive layers 130, and the first isolation structures 320 together can be referred as a common source line cut 340.

Reference is made to FIG. 2 to FIG. 5. The positions of the common source line cuts 340 in the neighboring common source lines 300 are shifted to prevent the common source lines 300 from being bended during the thermal manufacturing process. The common source lines 300 are extended along a first direction D1, and the common source lines 300 are arranged in a second direction D2 that is perpendicular to the first direction D1. The common source line cuts 340 are disposed in the common source lines 300b, 300c, and 300d. The common source line cuts 340 in the common source line 300b are shifted relative to the common source line cuts 340 in the common source line 300c, in the first direction D1. The common source line cuts 340 in the common source line 300c are shifted relative to the common source line cuts 340 in the common source line 300d, in the first direction D1. The common source line cuts 340 in the common source line 300b can be aligned with or shifted relative to the common source line cuts 340 in the common source line 300d, in the first direction D1.

Furthermore, the length L and the pitch P of each of the segments 310 of the common source lines 300 can be the same or different, as long as the positions of the common source line cuts 340 in the neighboring common source lines 300 are shifted.

Reference is made back to FIG. 1. The width W1 of each of the first isolation structures 320 is greater than or equal to the width W3 of each of the common source lines 300. In some embodiments, the width W2 of each of the second isolation structures 330 is greater than the width W1 of each of the first isolation structures 320, such that the bottom of the adjacent segments 310 of common source lines 300 can be completely cut and spaced apart from each other, thereby avoiding unwanted electrical short. The widths W1, W2, and W3 are measured in the second direction D2.

Additionally, a bottom surface of the second isolation structures 330 is below a top surface of the substrate 110, and a bottom surface of the common source lines 300 is below a bottom surface of the second isolation structures 330.

Many thermal processes are used during the manufacturing processes of the semiconductor device 100. These thermal processes may lead to oxide expansion such as in the vertical channel structures 200 and in the common source line cuts 340. By shifting the positions of the common source line cuts 340 in the neighboring common source lines 300, the stress caused by oxide expansion can be released and would not be accumulated. Therefore, the risk of the bending common source lines 300 can be reduced.

Figure 6:
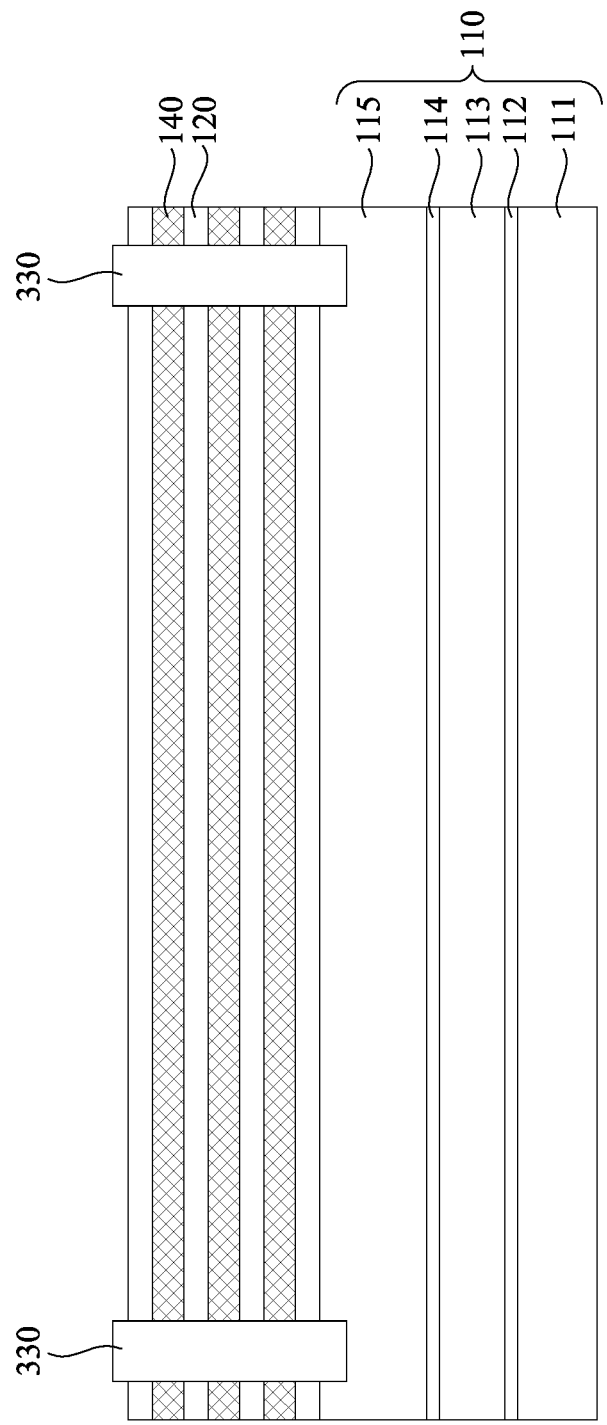
FIG. 6 to FIG. 14 are cross-sectional views of different stages of a method of forming a semiconductor device, according to some embodiments of the disclosure, respectively.

Reference is made to FIG. 6 to FIG. 14, which are cross-sectional views of different stages of a method of forming a semiconductor device, according to some embodiments of the disclosure, respectively. As shown in FIG. 6, a first stack of insulating layers 120 and sacrificial layers 140 are formed on the substrate 110, and the second isolation structures 330 are formed in the first stack of the insulating layers 120 and the sacrificial layers 140.

The substrate 110 includes a first poly silicon layer 111, a first oxide layer 112 on the first poly silicon layer 111, a second poly silicon layer 113 on the first oxide layer 112, a second oxide layer 114 on the second poly silicon layer 113, and a third poly silicon layer 115 on the second oxide layer 114.

In some embodiments, the second poly silicon layer 113 has a thickness smaller than the first poly silicon layer 111 and the third poly silicon layer 115. In some embodiments, the first poly silicon layer 111, the second poly silicon layer 113, and the third poly silicon layer 115 can be doped with N-type dopants such as, for example, phosphorus (P) and arsenic (As). In some other embodiments, the first poly silicon layer 111, the second poly silicon layer 113, and the third poly silicon layer 115 can be doped with P-type dopants such as, for example, boron (B) and gallium (Ga).

The insulating layers 120 and the sacrificial layers 140 are alternately stacked on the substrate 110, in which the bottommost layer of the first stack is the insulating layers 120. The material of the insulating layers 120 is different from the material of the sacrificial layers 140. In some embodiments, the insulating layers 120 are oxide layers such as silicon oxide layers, and the sacrificial layers 140 are nitride layers such as silicon nitride layers.

The second isolation structures 330 (e.g. the GSL cut) are formed in the first stack of the insulating layers 120 and the sacrificial layers 140. The material of the second isolation structures 330 is different from the material of the sacrificial layers 140. In some embodiments, the material of the second isolation structures 330 can be oxide such as silicon oxide. In some embodiments, an end of each of the second isolation structures 330 is inserted into the third poly silicon layer 115. In some other embodiments, the second isolation structures 330 can be terminated at the third poly silicon layer 115.

Figure 7:
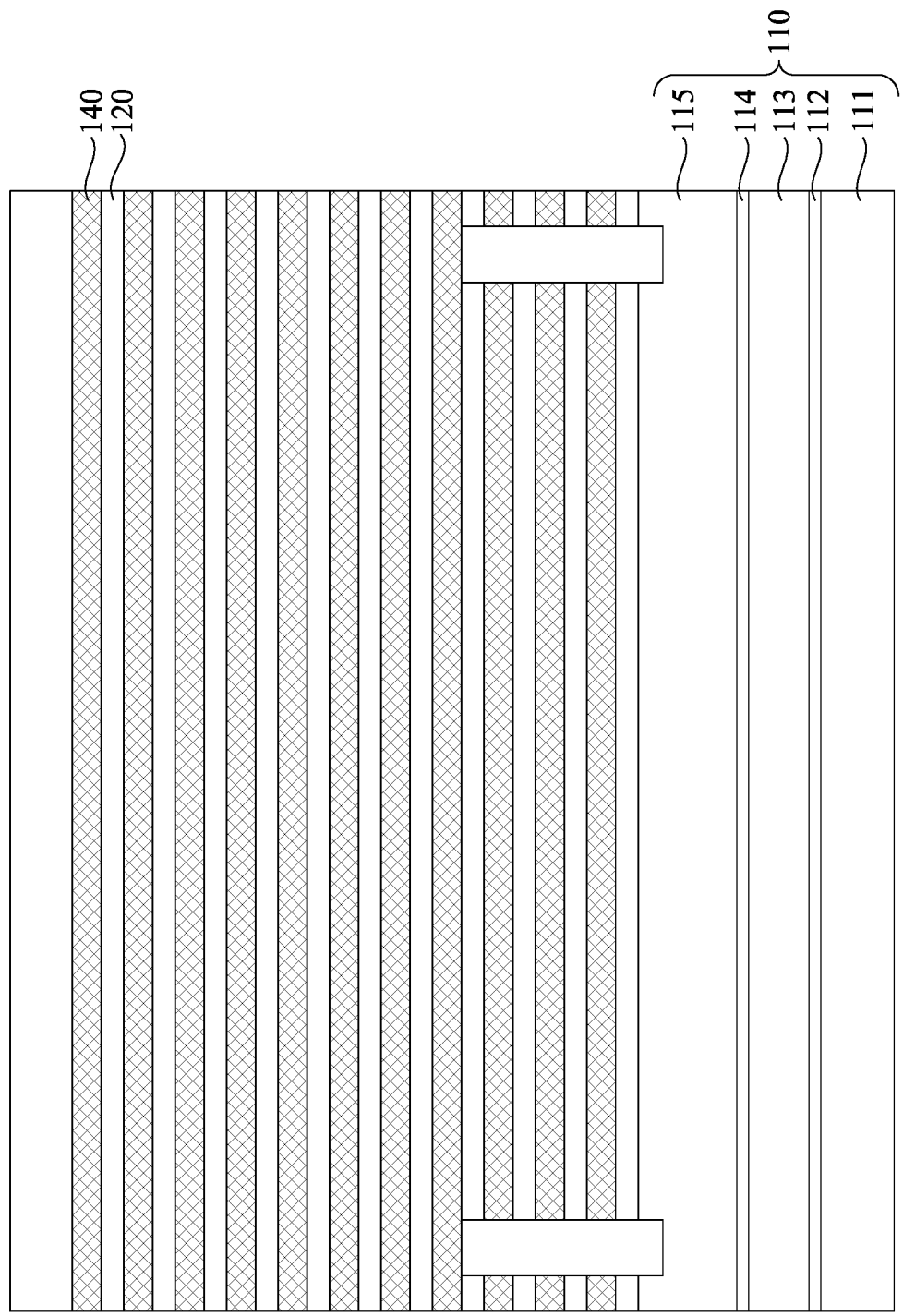

Reference is made to FIG. 7. A second stack of the insulating layers 120 and the sacrificial layers 140 is formed on the first stack of the insulating layers 120 and the sacrificial layers 140 thereby a stack including the insulating layers 120 and the sacrificial layers 140 is formed on the substrate 110. The topmost layer of the stack is the insulating layer 120.

Figure 8:
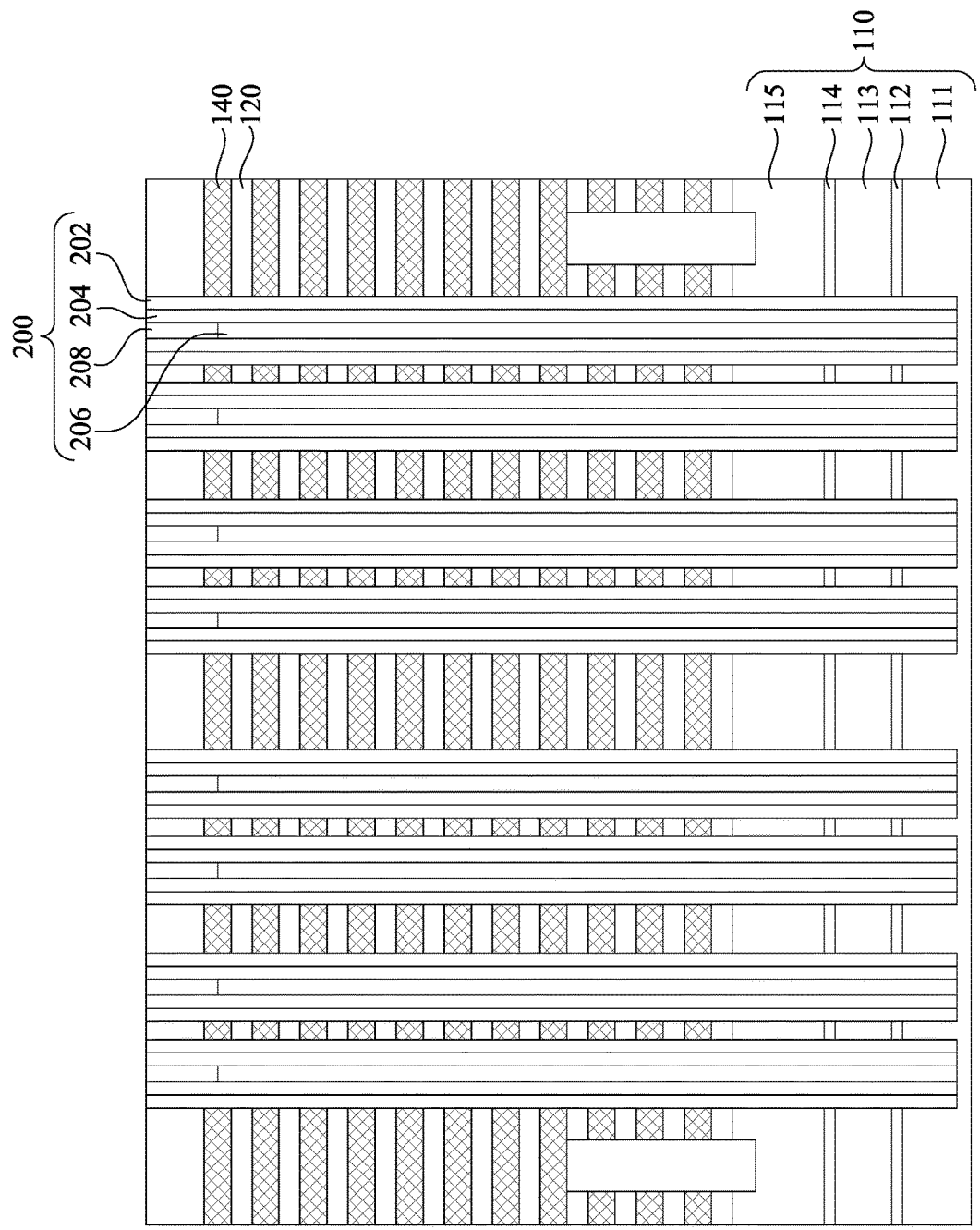

Reference is made to FIG. 8. A plurality of the vertical channel structures 200 are formed penetrating the stack of the insulating layers 120 and the sacrificial layers 140 and are further extend into the substrate 110. The vertical channel structures 200 are arranged parallel to the normal direction of the substrate 110. In some embodiments, the vertical channel structures 200 stop at the first poly silicon layer 111.

In some embodiments, each of the vertical channel structures 200 includes a storage layer 202, a channel layer 204, and an isolation pillar 206. The channel layer 204 is sandwiched between the storage layer 202 and the isolation pillar 206. In some embodiments, the storage layer 202 is a multi-layer structure, such as an oxide-nitride-oxide (ONO) layer that is able to trap electrons. The channel layer 204 may be made of a material including poly silicon, and the isolation pillar 206 may be made of dielectric material. Each of the vertical channel structures 200 further includes a conductive plug 208 disposed on the isolation pillar 206 and in contact with the channel layer 204. In some embodiments, the top surfaces of the conductive plug 208, the storage layer 202, the channel layer 204, and the topmost insulating layer 120 are substantially coplanar. The top surface of the isolation pillar 206 is below the top surface of the channel layer 204, and the sidewall of the conductive plug 208 is in contact with the channel layer 204.

Figure 9:
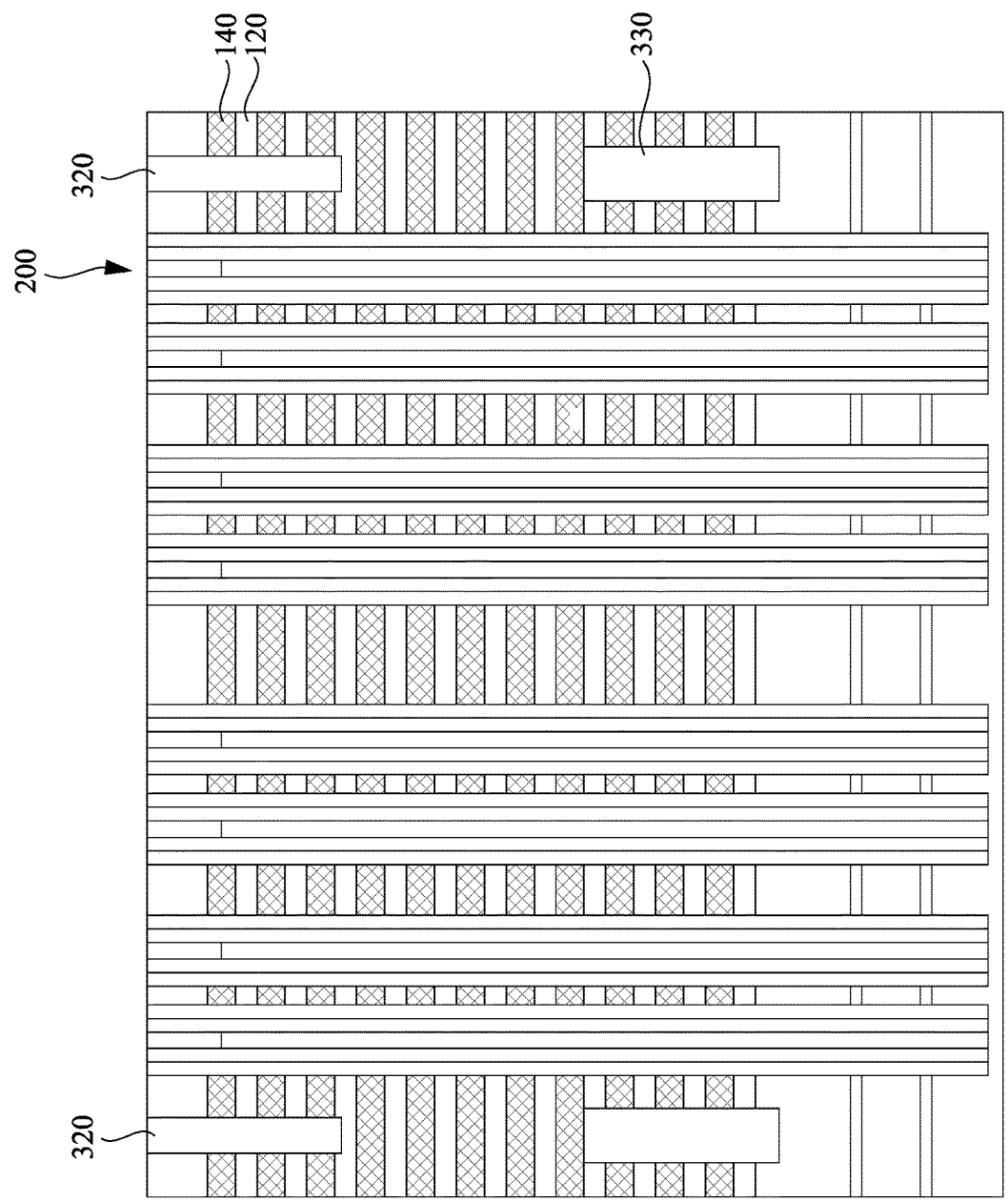

Reference is made to FIG. 9. A plurality of the first isolation structures 320 are formed in the upper region of the stack of the insulating layers 120 and the sacrificial layers 140. The material of the first isolation structures 320 is different from the material of the sacrificial layers 140. In some embodiments, the material of the first isolation structures 320 can be oxide such as silicon oxide. In some embodiments, an end of each of the first isolation structures 320 can be terminated at one of the insulating layers 120.

Figure 10:
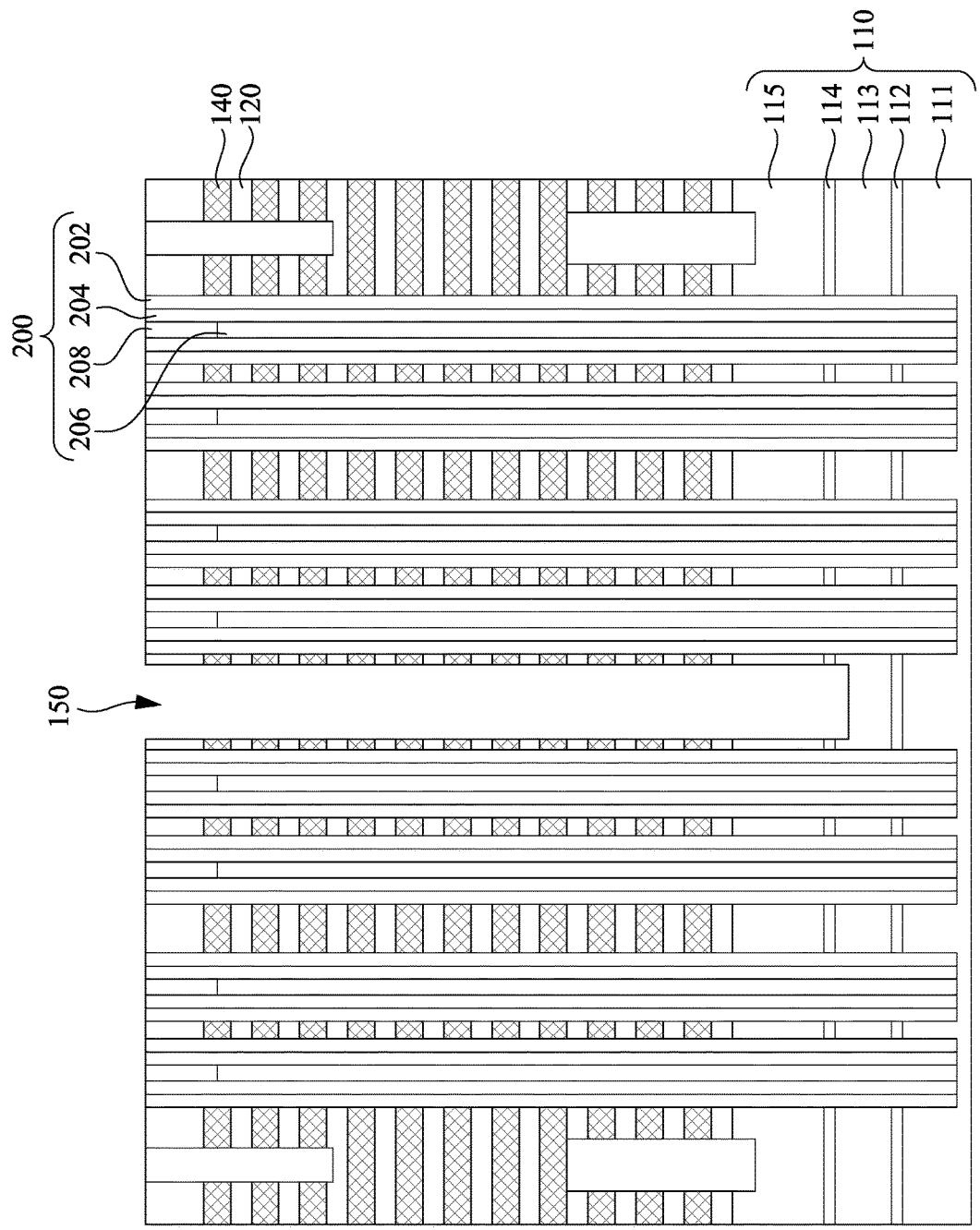

Reference is made to FIG. 10. An etching process is performed to form a plurality of trenches 150 penetrating the stack of the insulating layers 120 and the sacrificial layers 140, and trenches 150 stop at the third poly silicon layer 115 after the etching process. Then an additional etching process is performed to deepen the trenches 150 such that the trenches 150 further extend into the second poly silicon layer 113. The etching processes of forming the trenches 150 is a dry etching.

Please also refer to FIG. 2 for example. The trenches 150 are formed parallel along the first direction D1 and arranged in the second direction D2. Some of the trenches 150 such as the trenches 150 corresponding to the common source lines 300b, 300c, and 300d are formed cross through the corresponding second isolation structures 330 (e.g. the GSL cut) and the first isolation structures 320 (e.g. the SSL cut) thereon, and portions of the sacrificial layers 140 between the first isolation structures 320 and the second isolation structures 330 are still remained after the trenches 150 are formed.

Figure 11:
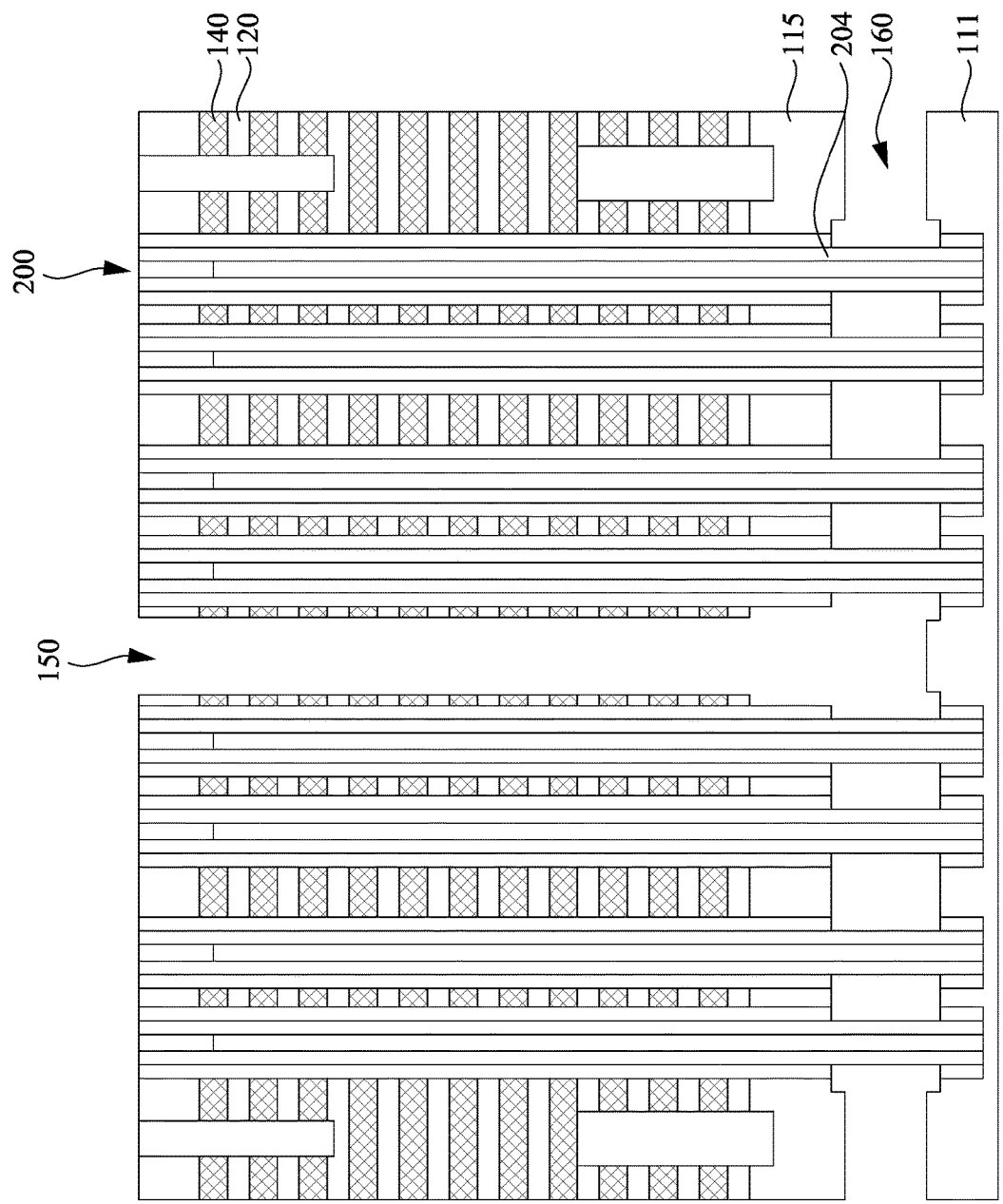

Reference is made to FIG. 11. A wet etching process is performed to remove the second poly silicon layer 113 (see FIG. 10) thereby exposing portions of the vertical channel structures 200. Then sequence of wet etching processes using different etchants are performed to remove the first oxide layer 112, the second oxide layer 114, and the storage layer 202 (see FIG. 10) including the ONO structure. After the wet etching processes are performed, a cavity 160 is formed between the first poly silicon layer 111 and the third poly silicon layer 115. The cavity 160 is connected to the trenches 150. Portions of the channel layers 204 of the vertical channel structures 200 are exposed by the cavity 160.

In some embodiments, a temporary spacer (not shown) is formed on the sidewall of the stack of the insulating layers 120 and the sacrificial layers 140, to prevent the insulating layers 120 and the sacrificial layers 140 from being damaged during the etching processes to remove the storage layer 202.

Figure 12:
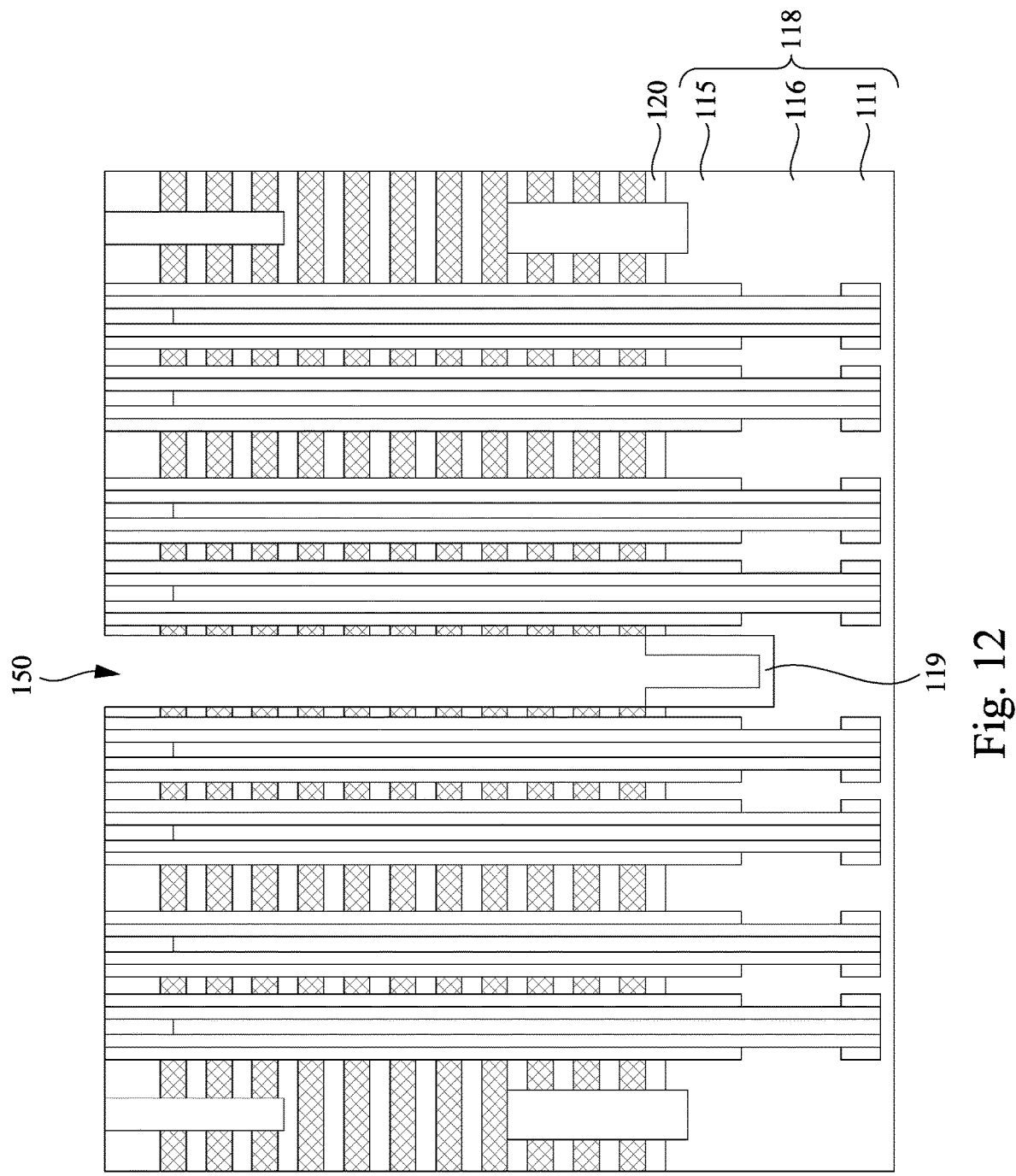

Reference is made to FIG. 12. Additional poly silicon material 116 is epitaxially grown and refilled in the cavity 160 (see FIG. 11). The poly silicon material 116 can be silicon doped with N-type dopants such as, for example, phosphorus (P) and arsenic (As) or doped with P-type dopants such as, for example, boron (B) and gallium (Ga). The combination of the remained third poly silicon layer 115, the poly silicon material 116, and the first poly silicon layer 111 is referred as a doped poly silicon layer 118.

After the doped poly silicon layer 118 is formed, an etch back process is performed to remove a portion of the doped poly silicon layer 118, thereby deepening the trenches 150 again. An oxidation process such as a thermal oxidation process is performed to transfer the surface of the doped poly silicon layer 118 to silicon oxide, thereby forming a fourth oxide layer 119 on the surface of the doped poly silicon layer 118. In some embodiments, the fourth oxide layer 119 has a U-shape cross-section and is connected to the bottommost insulating layer 120.

Figure 13:
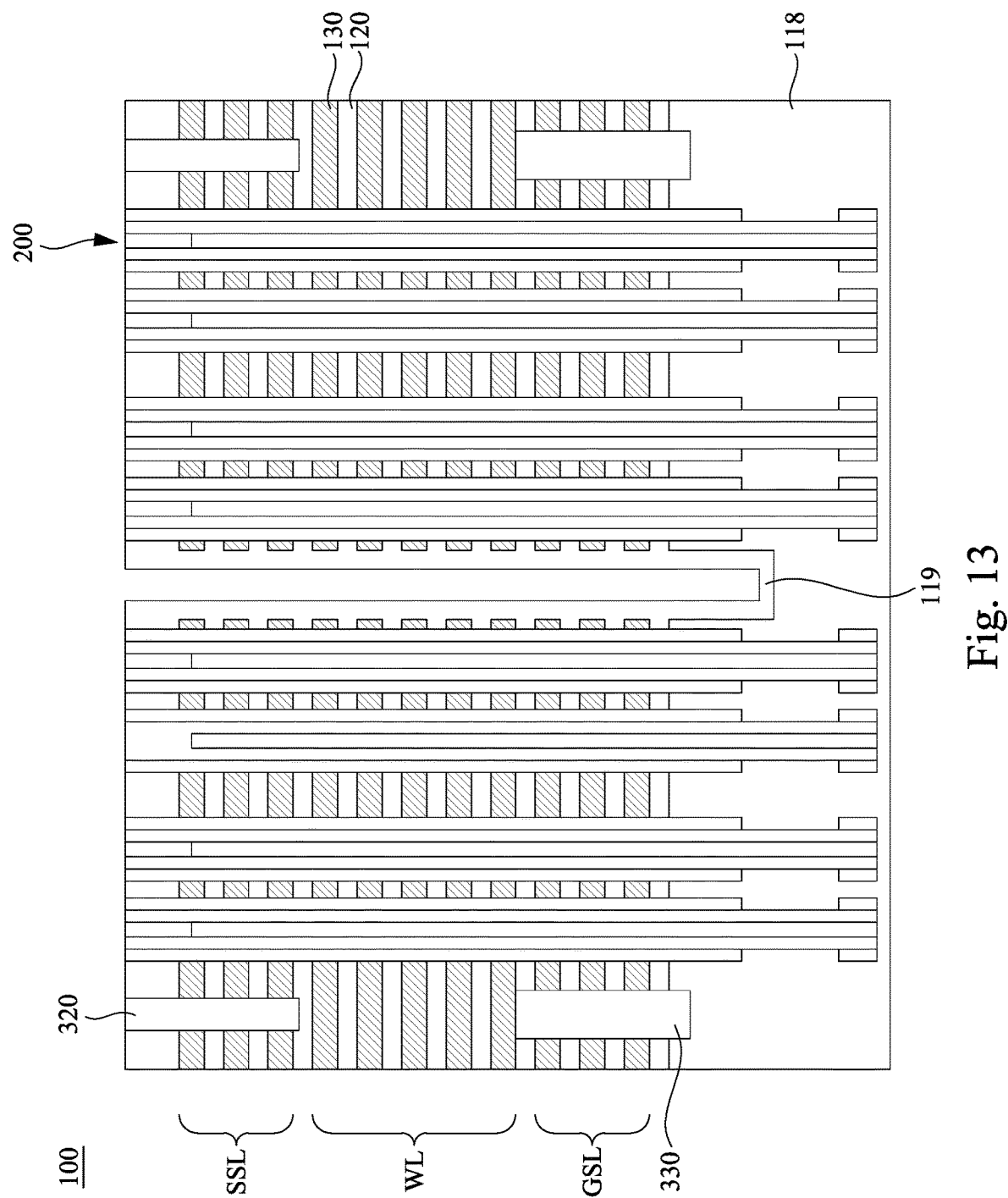

Reference is made to FIG. 13. A replacement process is performed such that the sacrificial layers 140 (see FIG. 12) are replaced by the conductive layers 130. The replacement process includes an etching process to remove the sacrificial layers 140. More particularly, the sacrificial layers 140 are silicon nitride layers, and the etching process is performed using an etchant that has a greater nitride etching rate than an oxide etching rate such that the insulating layers 120, which are silicon oxide layers, are remained after the sacrificial layers 140 are removed. Because the sidewall of the doped poly silicon layer 118 is covered by the fourth oxide layer 119, the doped poly silicon layer 118 would not be damaged by the etching process.

A plurality of the conductive layers 130 are formed between the insulating layers 120 and surrounding the vertical channel structures 200. Each of the conductive layers 130 includes one or more conductive materials such as tungsten (W) or the likes as filling metal.

In some embodiments, one or more of the conductive layers 130 at top of the semiconductor device 100 serve as string select lines of the semiconductor device 100, and these string select lines are penetrated by the first isolation structures 320 (e.g. the SSL cut). One or more of the conductive layers 130 at bottom of the semiconductor device 100 serve as ground select lines of the semiconductor device 100, and these ground select lines are penetrated by the second isolation structures 320 (e.g. the GSL cut). The rest of the conductive layers 130 serve as word lines of the semiconductor device 100, and the word lines are laterally extended between the first isolation structures 320 and the second isolation structures 320.

Figure 14:
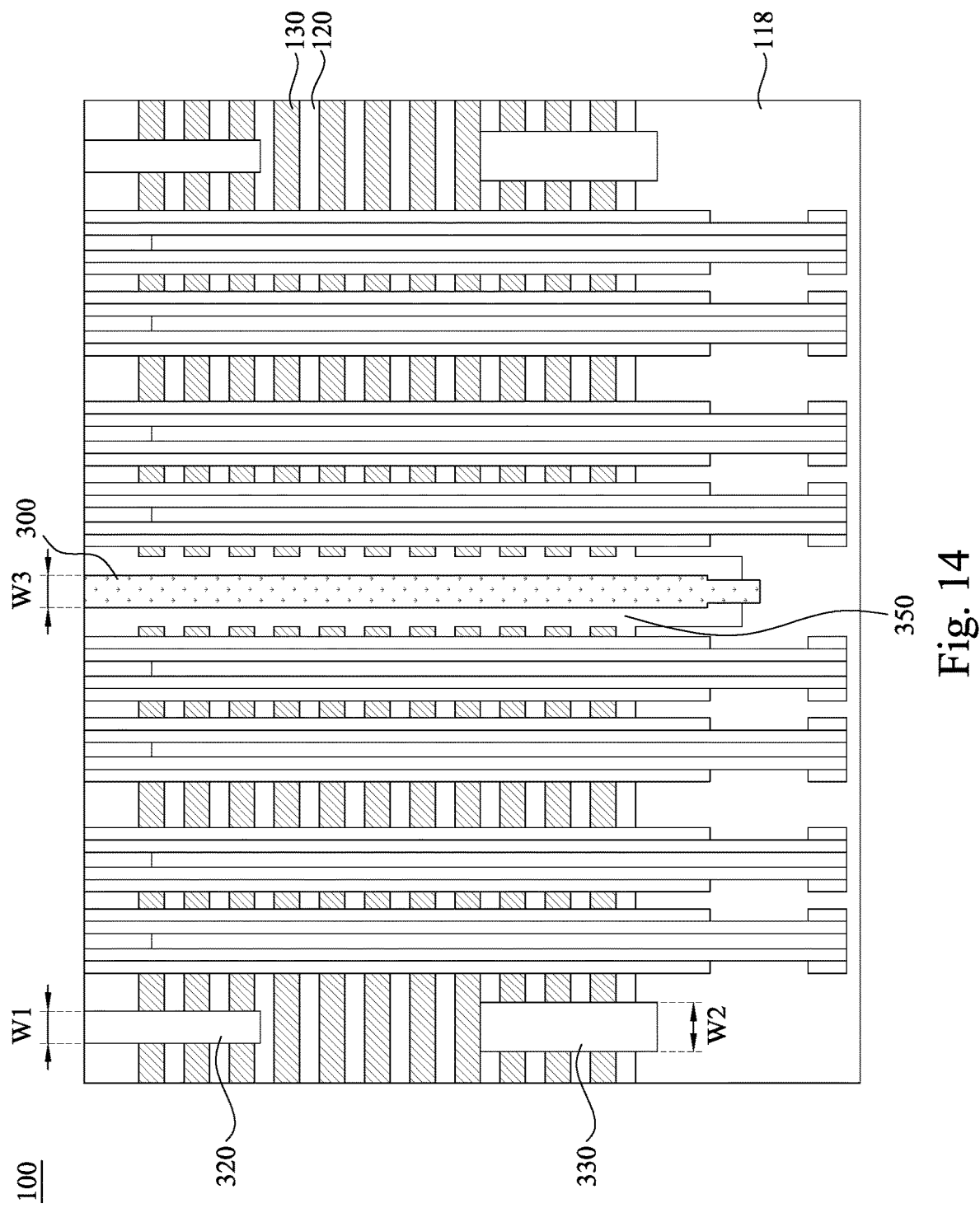

Reference is made to FIG. 14. After the conductive layers 130 are formed, an etch back process is performed to recess the conductive layers 130, such that the sidewalls of the conductive layers 130 are recessed from the sidewalls of the insulating layers 120. The sidewalls of the conductive layers 130 can be flat, concave, or convex after the etch back process.

Additional oxide material is deposited in the trenches 150 (see FIG. 13) and on the sidewalls of the conductive layers 130, the insulating layers 120, and the fourth oxide layer 119 (see FIG. 13). Then an etching process is performed to remove a portion of the oxide material and remove a bottom of the fourth oxide layer 119 to open the fourth oxide layer 119, such that the doped poly silicon layer 118 is revealed from the opened fourth oxide layer 119. The remaining oxide material can be regarded as isolation spacers 350.

A deposition process is performed to form the common source lines (CSL) 300 filling the trenches 150. The isolation spacers 350 are disposed between the common source lines 300 and the conductive layers 130. A bottom surface of the isolation spacers 350 is below a top surface of the doped poly silicon layer 118. The common source lines 300 can be doped poly silicon. In some other embodiments, the common source lines 300 can be conductive metal such as tungsten. In yet some other embodiments, the material of the common source lines 300 can be a combination of doped poly silicon and tungsten. The common source lines 300 are deposited on the doped poly silicon layer 118, in which the doped poly silicon layer 118 serves as a common source plane of the semiconductor device 100.

The common source lines are cut by the common source line cuts including the first isolation structures and the second isolation structures into a plurality of segments. The positions of the common source line cuts including the first isolation structures and the second isolation structures in the neighboring common source lines are shifted. The stress caused by oxide expansion during the thermal process can be released through the shifted common source line cuts and would not be accumulated thereby preventing the common source lines from being bended during the thermal manufacturing process.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device comprising:
   a substrate;
   a stack disposed on the substrate, the stack comprising a plurality of insulating layers and a plurality of conductive layers alternately arranged;
   a first common source line disposed in the stack and connected to the substrate, the first common source line being extended along a first direction, the first common source line comprising a first segment and a second segment spaced apart by a first common source line cut; and
   a second common source line disposed in the stack and connected to the substrate, the second common source line being extended along the first direction, the second common source line comprising a third segment and a fourth segment spaced apart by a second common source line cut, wherein the first common source line and the second common source line are arranged in a second direction that is perpendicular to the first direction, and the first common source line cut is shifted relative to the second common source line cut in the first direction, wherein each of the first common source line cut and the second common source line cut comprises a first isolation structure at a top of the stack and a second isolation structure at a bottom of the stack, and the first isolation structure is spaced from the second isolation structure by a portion of the stack comprising the plurality of insulating layers and the plurality of conductive layers.

2. The semiconductor device of claim 1, wherein the second common source line is directly neighboring the first common source line.

3. The semiconductor device of claim 1, further comprising a third common source line comprising a fifth segment and a sixth segment spaced apart by a third common source line cut, wherein the second common source line is between the third common source line and the first common source line, and the third common source line cut is shifted relative to the second common source line cut in the first direction.

4. The semiconductor device of claim 3, wherein the third common source line cut is aligned with or shifted relative to the first common source line cut in the first direction.

5. The semiconductor device of claim 1, wherein a second width of the second isolation structure is greater than a first width of the first isolation structure, in which the first width and the second width are measured in the second direction.

6. The semiconductor device of claim 1, wherein the stack comprises a ground select line region on the substrate, a string select line region, and a word line region between the ground select line region and the string select line region, the first isolation structure is disposed in the string select line region, and the second isolation structure is disposed in the ground select line region.

7. The semiconductor device of claim 6, wherein the conductive layers comprises a word line in the word line region, and the word line extends through the first common source line cut and the second common source line cut.

8. The semiconductor device of claim 1, wherein the first isolation structure and the second isolation structure are oxide.

9. The semiconductor device of claim 1, wherein a bottom surface of the second isolation structure is below a top surface of the substrate.

10. The semiconductor device of claim 1, wherein a bottom surface of the first common source line is below a bottom surface of the second isolation structure.

11. The semiconductor device of claim 1, further comprising a plurality of vertical channel structures disposed in the stack and connected to the substrate.

12. The semiconductor device of claim 1, further comprising an isolation spacer between the first common source line and the conductive layers.

* * * * *